(12) United States Patent
Kokuda et al.

(10) Patent No.: US 10,644,092 B2
(45) Date of Patent: May 5, 2020

(54) DISPLAY PANEL AND DISPLAY DEVICE

(71) Applicant: JOLED INC., Tokyo (JP)

(72) Inventors: Kenji Kokuda, Tokyo (JP); Masafumi Matsui, Tokyo (JP); Hitoshi Tsuge, Tokyo (JP); Takashi Osako, Tokyo (JP); Shigeo Homura, Tokyo (JP); Ryoichi Yasuda, Tokyo (JP)

(73) Assignee: JOLED INC., Tokyo (JP)

( * ) Notice: Subject to any disclaimer, the term of this patent is extended or adjusted under 35 U.S.C. 154(b) by 119 days.

(21) Appl. No.: 16/053,320

(22) Filed: Aug. 2, 2018

(65) Prior Publication Data

US 2019/0115413 A1 Apr. 18, 2019

(30) Foreign Application Priority Data

Oct. 17, 2017 (JP) ................................. 2017-201158

(51) Int. Cl.
*H01L 27/32* (2006.01)
*G09G 3/3233* (2016.01)
*G09G 3/3266* (2016.01)

(52) U.S. Cl.
CPC ....... *H01L 27/3276* (2013.01); *G09G 3/3233* (2013.01); *G09G 3/3266* (2013.01); *G09G 2300/023* (2013.01); *G09G 2300/0426* (2013.01); *G09G 2330/021* (2013.01); *G09G 2330/12* (2013.01)

(58) Field of Classification Search
None
See application file for complete search history.

(56) References Cited

U.S. PATENT DOCUMENTS

2012/0327063 A1\* 12/2012 Izawa .................. G09G 3/3208
345/212
2016/0351093 A1\* 12/2016 Kim ..................... G09G 3/2092

FOREIGN PATENT DOCUMENTS

JP 2011-169992 9/2011

\* cited by examiner

*Primary Examiner* — Matthew Yeung
(74) *Attorney, Agent, or Firm* — Greenblum & Bernstein, P.L.C.

(57) ABSTRACT

A display panel includes a contact area which includes an upper conductive layer forming first electrodes of the organic EL elements, a lower conductive layer disposed below the upper conductive layer, a middle layer between the upper conductive layer and the lower conductive layer, and an insulating layer between the lower conductive layer and the middle layer. The middle layer includes a first area and a second area which are conductive and electrically connected to the upper conductive layer, and an insulating separating area which separates the first area and the second area. The lower conductive layer includes a first line which is electrically connected to the first area via a first contact hole, and a second line which is electrically connected to the second area via a second contact hole.

6 Claims, 10 Drawing Sheets

DISPLAY PANEL AND DISPLAY DEVICE

CROSS REFERENCE TO RELATED APPLICATION

The present application is based on and claims priority of Japanese Patent Application No. 2017-201158 filed on Oct. 17, 2017. The entire disclosure of the above-identified application, including the specification, drawings and claims is incorporated herein by reference in its entirety.

FIELD

The present disclosure relates to a display panel and a display device which include an organic electroluminescent (EL) element.

BACKGROUND

Conventionally, display devices which include organic EL elements have been developed. In such display devices, organic EL elements are caused to emit light upon voltage being applied between anodes and cathodes of the organic EL elements. A power source for applying a cathode voltage via a line is connected to the cathode of the organic EL element. Here, in the line extending from the power source to the cathode, contact resistance is present at a contact portion of a terminal, for example, where two conductors are brought into contact. If there is a poor connection at the contact portion, the contact resistance at the contact portion increases, and the desired potential cannot be applied to the cathode. Accordingly, the organic EL element cannot be caused to emit light at the desired luminance. In addition, depending on the pixel driving method, if the contact resistance is high at the contact portion, the contact resistance may cause poor image quality such as crosstalk.

In view of the above, a display device, which can measure contact resistance present between a power source and a display panel, has been proposed (for example, see Patent Literature (PTL) 1). The display device disclosed in PTL 1 causes the organic EL element to emit light at a desired luminance by measuring contact resistance present at a line extending from the power source to the display panel and applying a potential according to the contact resistance.

CITATION LIST

Patent Literature

PTL 1: Japanese Unexamined Patent Application Publication No. 2011-169992

SUMMARY

Technical Problem

According to the display device disclosed in PTL 1, the potential of a terminal provided for the display panel is measured as the cathode potential, and the contact resistance from the power source to the cathode is measured based on the measured potential. However, at least one contact portion is typically present between the terminal and a conductive layer that forms the cathode. Accordingly, the contact resistance in the display panel cannot be measured in the display device disclosed in PTL 1. In other words, in the display device disclosed in PTL 1, the potential of the conductive layer that forms the cathode cannot be measured, and thus the contact resistance present between the conductive layer and the terminal of the display panel cannot be measured.

The present disclosure has been conceived in view of the above problems, and has as an object to provide a display panel, which includes an organic EL element, in which a potential of a conductive layer included in an electrode of the organic EL element can be measured, and a display device which includes the display panel.

Solution to Problem

In order to achieve the aforementioned object, a display panel according to an aspect of the present disclosure includes: a display area including pixels each of which includes an organic electroluminescent (EL) element; and a contact area outside the display area, wherein the contact area includes: an upper conductive layer forming first electrodes of the organic EL elements; a lower conductive layer below the upper conductive layer; a middle layer between the upper conductive layer and the lower conductive layer; and an insulating layer between the lower conductive layer and the middle layer, the insulating layer includes a first contact hole and a second contact hole, the middle layer includes: a first area and a second area which are electrically connected to the upper conductive layer, the first area and the second area being conductive areas; and a separating area which separates the first area and the second area, the separating area being an insulating area, and the lower conductive layer includes: a first line which is electrically connected to the first area via the first contact hole; and a second line which is electrically connected to the second area via the second contact hole.

In addition, in order to achieve the aforementioned object, a display device according to an aspect of the present disclosure includes: the display panel described above.

Advantageous Effects

According to the present disclosure, it is possible to provide a display panel which includes an organic EL element in which potential of a conductive layer that forms an electrode of the organic EL element can be measured, and a display device which includes the display panel.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Hereinafter, embodiments of the present disclosure will be described with reference to the drawings. Note that the embodiments described below show specific examples according to the present disclosure. Therefore, the numerical values, shapes, materials, elements, the arrangement and connection of the elements, processes, the order of the processes, and the like described in the following embodiments are mere examples, and thus are not intended to limit the present disclosure. Accordingly, among the elements in the following exemplary embodiments, elements not recited in any of the independent claims defining the broadest concept of the present disclosure are described as arbitrary elements.

Note that the drawings are schematic diagrams, and do not necessarily provide strictly accurate illustrations. Throughout the drawings, the same sign is given to substantially the same element, and redundant description is omitted or simplified.

In addition, as the drawings are schematic diagrams, and do not necessarily provide strictly accurate illustration, scales and the like do not necessarily coincide throughout the drawings.

Moreover, in the present specification, terms "upper/above" and "lower/below" do not indicate an upward (vertically upward) direction and a downward (vertically downward) direction in terms of absolute spatial recognition. The terms are used as terms defined by relative positional relationships based on the stacking order of a stacked configuration. In addition, the terms "upper/above" and "lower/below" are applied not only when two elements are disposed spaced apart, with another element interposed between the two elements, but also when the two elements are disposed in contact with each other.

Embodiment 1

[1-1 Overall Configuration of Display Panel]

Figure 1A:
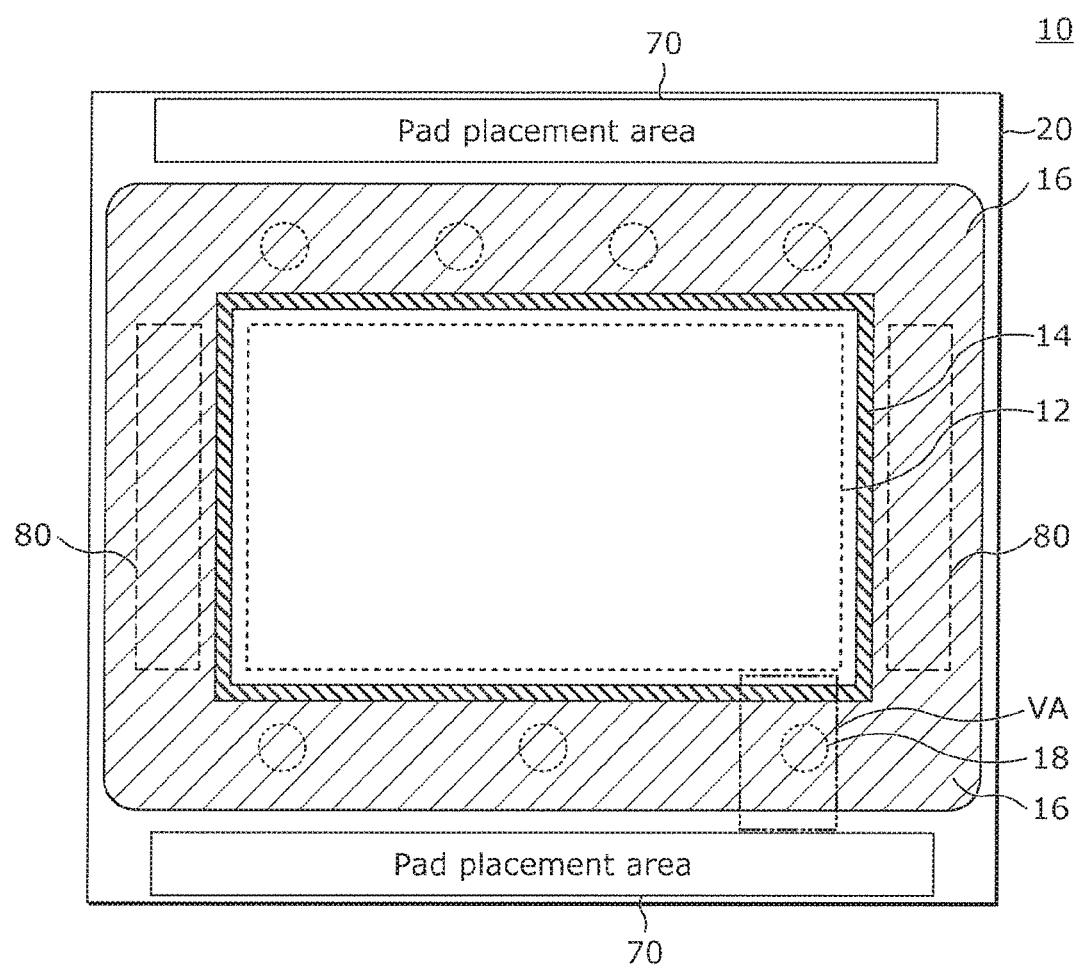
FIG. 1A is a schematic plan view of an overall configuration a display panel according to Embodiment 1.
Figure 1B:
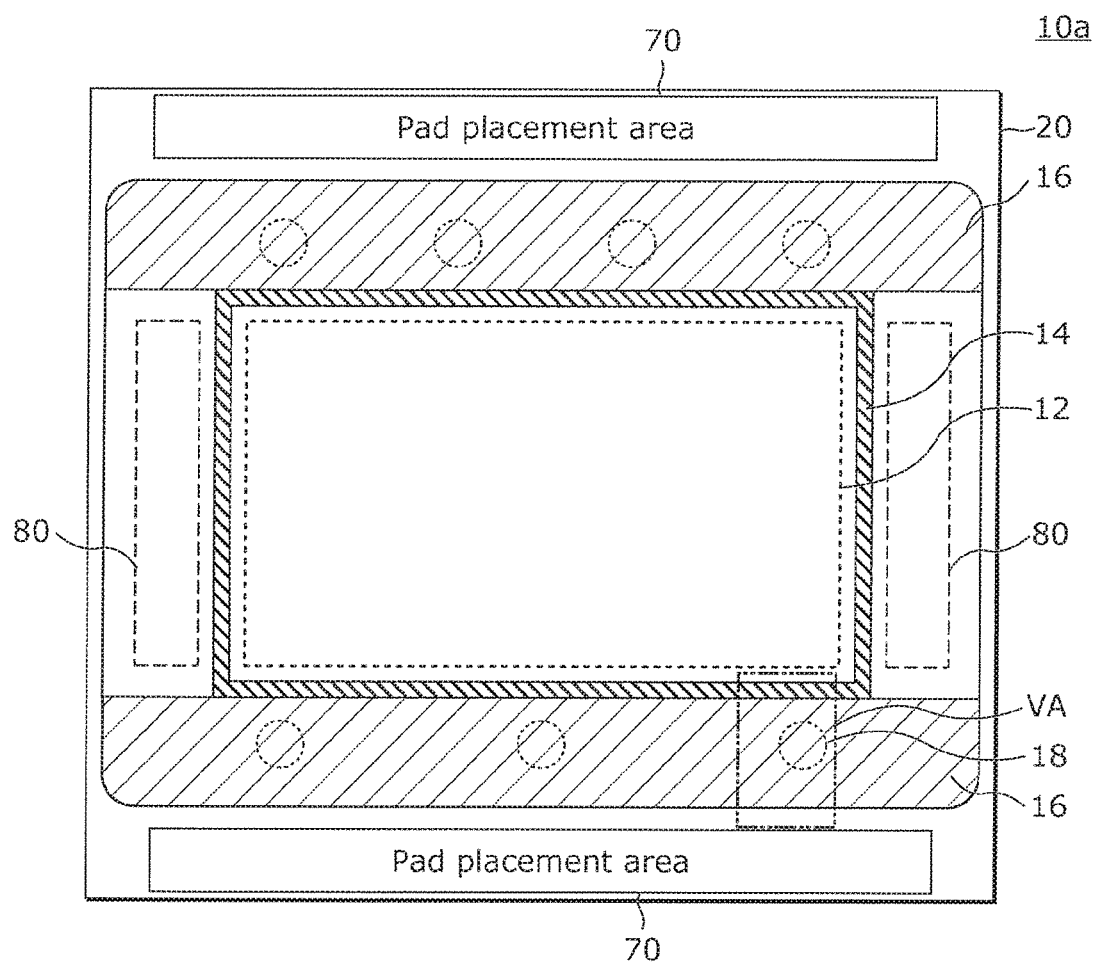
FIG. 1B is a schematic plan view of an overall configuration of a display panel according to a variation of Embodiment 1.

An overall configuration of a display panel according to Embodiment 1 will be described with reference to drawings. FIG. 1A is a schematic plan view of an overall configuration of a display panel 10 according to the present embodiment. FIG. 1B is a schematic plan view of an overall configuration of a display panel 10a according to a variation of the present embodiment.

The display panel 10 according to the present embodiment is a display panel which includes an organic EL element. As illustrated in FIG. 1A, the display panel 10 includes a display area 12 and a contact area 16. According to the present embodiment, the display panel 10 further includes pad placement areas 70, gate-drive circuit areas 80, and an insulating area 14. The display panel 10 includes a substrate 20 formed from a glass substrate, etc., and the aforementioned areas are formed by the substrate 20 and, for instance, circuits disposed on the substrate 20.

[1-2 Display Area]

Figure 2:
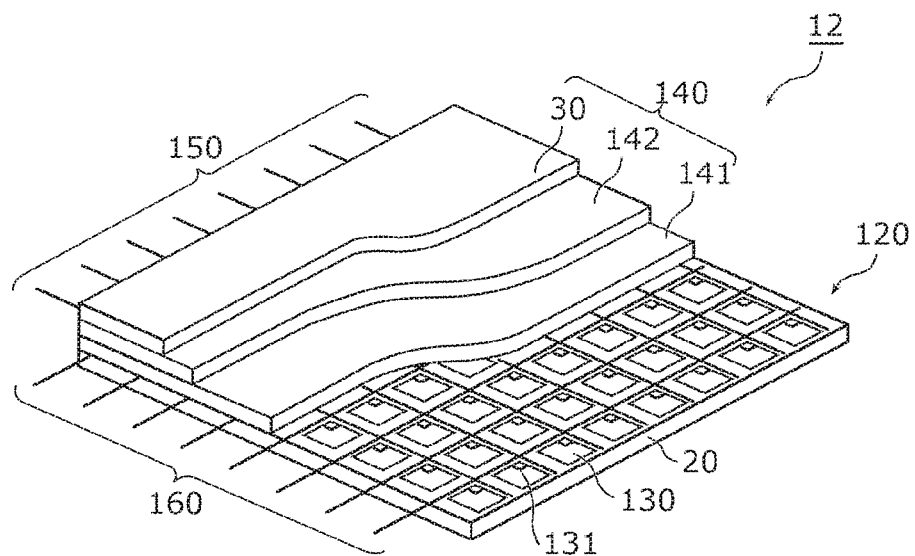
FIG. 2 is a schematic cross-sectional view of an example of a configuration of a display area according to Embodiment 1.
Figure 3:
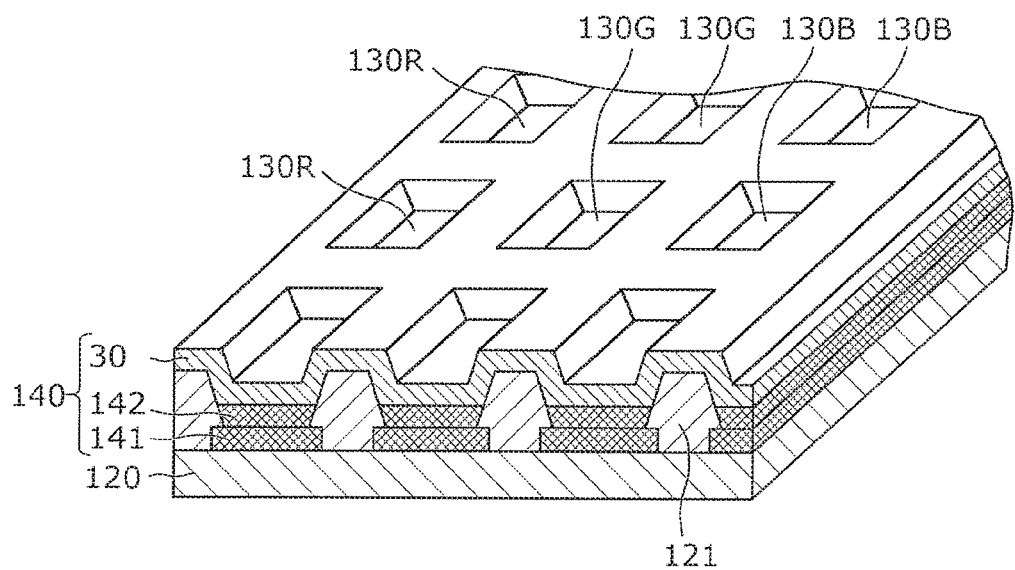
FIG. 3 is a perspective view of an example of a pixel bank in the display area according to Embodiment 1.

The display area 12 will be described below with reference to drawings. FIG. 2 is a schematic cross-sectional view of an example of a configuration of the display area 12 according to the present embodiment. FIG. 3 is a perspective view of an example of a pixel bank in the display area 12 according to the present embodiment.

The display area 12 includes pixels each of which includes an organic EL element. As illustrated in FIG. 2, the display area 12 is configured as a stacked structure which includes a thin-film transistor (TFT) substrate 120 and organic EL elements 140.

The TFT substrate 120 is a substrate on which a plurality of thin-film transistors is disposed. The TFT substrate 120 includes the substrate 20 and the pixels 130 disposed in a matrix on the substrate 20. Each pixel 130 includes a pixel circuit 131.

The organic EL element 140 is a light emitting element which includes an anode 141, an electroluminescent (EL) layer 142 which is a light-emitting layer that includes organic material, and an upper conductive layer 30 which is a light-transmissive cathode. The organic EL element 140 is included in each pixel 130, and the light emission of the organic EL element 140 is controlled by the pixel circuit 131 included in each pixel 130. The organic EL element 140 is disposed on an interlayer insulation film (a planarizing layer) disposed so as to cover the thin-film transistors.

In addition, in the organic EL element 140, the EL layer 142 is disposed between the anode 141 and the upper conductive layer 30. A hole-transport layer (not illustrated in the drawings) is stacked between the anode 141 and the EL layer 142, and an electron-transport layer (not illustrated in the drawings) is also stacked between the EL layer 142 and the upper conductive layer 30. Note that other organic function layers may be provided between the anode 141 and the upper conductive layer 30.

The pixels 130 are driven by the pixel circuits 131. In addition, the TFT substrate 120 includes gate lines (scan lines) 150 disposed along a row direction of the pixels 130, source lines (signal lines) 160 disposed along a column direction of the pixels 130 so as to cross the gate lines 150, and power-supply lines (not illustrated in FIG. 2) disposed in parallel with the source lines 160. For example, each of the pixels 130 is bounded by the gate lines 150 and the source lines 160 that orthogonally cross each other.

The gate line 150 is connected to, for each row, a gate electrode of a thin-film transistor which operates as a switching element included in each pixel circuit 131. The source line 160 is connected to, for each column, a source electrode of the thin-film transistor which operates as the switching element included in each pixel circuit 131. The power-supply line is connected to, for each column, a drain electrode of a thin-film transistor which operates as a drive element included in each pixel circuit 131.

As illustrated in FIG. 3, each pixel 130 included in the display area 12 includes subpixels 130R, 130G, and 130б which are in three colors (red, green, and blue), and a plurality of the subpixels 130R, 130G, and 130б is arranged in a matrix on a display surface of the display area 12, The subpixels 130R, 130G, and 130б are separated from each other by banks 121.

The banks 121 are formed in a lattice pattern with elongated protrusions extending in parallel with the gate lines 150 and elongated protrusions extending in parallel with the source lines 160 crossing with each other. Each of the portions enclosed by the elongated protrusions (that is, the openings of the banks 121) and each of the subpixels 130R, 130G, and 130B correspond to each other on a one-to-one basis. Note that in the present embodiment, the banks 121 are a pixel banks, but the banks 121 maybe line banks.

The anode 141 is disposed, for each of the subpixels 130R, 130G, and 130б, on the interlayer insulation film (the planarizing layer) stacked above the TFT substrate 120 and inside the opening of the bank 121. Similarly, the EL layer 142 is disposed, for each of the subpixels 130R, 130G, and 130б, on the anode 141 and inside the opening of the bank 121, The light-transmissive upper conductive layer 30 is continuously formed on the banks 121 so as to cover the entire EL layer 142 (all of the subpixels 130R, 130G, and 130B).

In addition, the pixel circuit 131 is provided in each of the subpixels 130R, 130G, and 130B, and each of the subpixels 130R, 130G, and 130б and the corresponding pixel circuits 131 are electrically connected by using a contact hole and a relay electrode. Note that the subpixels 130R, 130G, and 130б have the same configuration except for the color of light emitted by the EL layer 142.

[1-3 Pixel Circuit]

Figure 4:
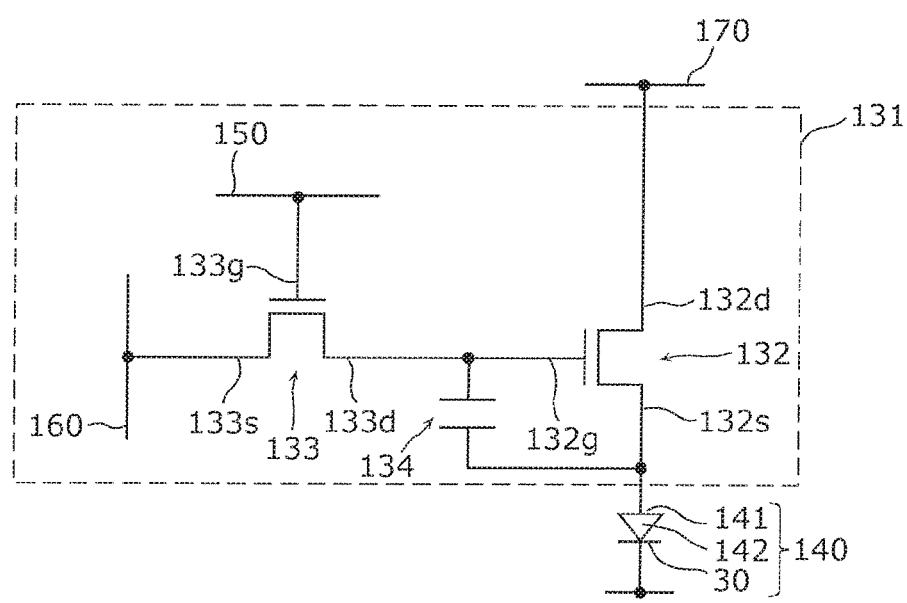
FIG. 4 is an electric circuit diagram illustrating an example of a configuration of a pixel circuit in the display panel according to Embodiment 1.

Here, an example of a circuit configuration of the pixel circuit 131 in the pixel 130 will be described with reference to FIG. 4. FIG. 4 is an electric circuit diagram illustrating an example of a configuration of the pixel circuit 131 in the display panel 10 according to the present embodiment.

As illustrated in FIG. 4, the pixel circuit 131 includes a thin-film transistor 132 which operates as a drive element, a thin-film transistor 133 which operates as a switching element, and a capacitor 134 which stores data to be displayed on the corresponding pixel 130. In the present embodiment, the thin-film transistor 132 is a drive transistor for driving the organic EL element 140, and the thin-film transistor 133 is a switching transistor for selecting the pixel 130.

The thin-film transistor 132 includes a gate electrode 132$g$ connected to a drain electrode 133$d$ of the thin-film transistor 133 and one end of the capacitor 134, a drain electrode 132$d$ connected to a power-supply line 170, a source electrode 132$s$ connected to the other end of the capacitor 134 and the anode 141 of the organic EL element 140, and a semiconductor film (not illustrated in the drawings). The thin-film transistor 132 supplies, from the power-supply line 170 to the anode 141 of the organic EL element 140 via the source drain 132$s$, a current corresponding to data voltage held by the capacitor 134. In this manner, in the organic EL element 140, a driving current flows from the anode 141 to the upper conductive layer 30, and thus the EL layer 142 emits light.

The thin-film transistor 133 includes a gate electrode 133$g$ connected to the gate line 150, a source electrode 133$s$ connected to the source line 160, the drain electrode 133$d$ connected to the one end of the capacitor 134 and the gate electrode 132$g$ of the thin-film transistor 132, and a semiconductor film (not illustrated in the drawings), When a predetermined voltage is applied to the gate line 150 and the source line 160 which are connected to the thin-film transistor 133, the voltage applied to the source line 160 is stored in the capacitor 134 as a data voltage.

Note that the display area 12 configured as described above adopts an active matrix system in which display control is performed for the respective pixels 130 located at the crosspoints of the gate lines 150 and the source lines 160. In this manner, the thin-film transistors 132 and 133 in each pixel 130 (each subpixels 130R, 130G, and 130B) can cause the corresponding organic EL element 140 to selectively emit light, and thus the desired image is displayed.

[1-4 Contact Area]

The contact area 16 will be described. The contact area 16 is the area disposed outside the display area 12 where the conductive layer disposed in the display area 12 and the other conductive layer come into contact with each other. According to the present embodiment, as illustrated in FIG. 1A, the contact area 16 is disposed outside the display area 12, along the perimeter of the outer edges of the display area 12 in the shape of a rectangle. Note that the configuration of the contact area 16 is not limited to the above. For example, like the display panel 10$a$ according to a variation of the present embodiment illustrated in FIG. 1B, two contact areas 16 may be disposed along the two long sides of the outer edges of the rectangular display area 12. In this case, the two contact areas 16 are disposed at mutually opposing positions with the display area 12 interposed between the two contact areas 16. Like the display panel 10$a$ according to the present variation, the two contact areas 16 may be disposed at positions that do not overlap with the gate drive circuit areas 80. Note that the configurations of the display panel 10 according to the present embodiment illustrated in FIG. 1A and the display panel 10$a$ according to the variation of the present embodiment are the same, except for the arrangement configuration of the contact area 16. Hereinafter, as a representative example of the above, the display panel 10 illustrated in FIG. 1A will be described.

Figure 5A:
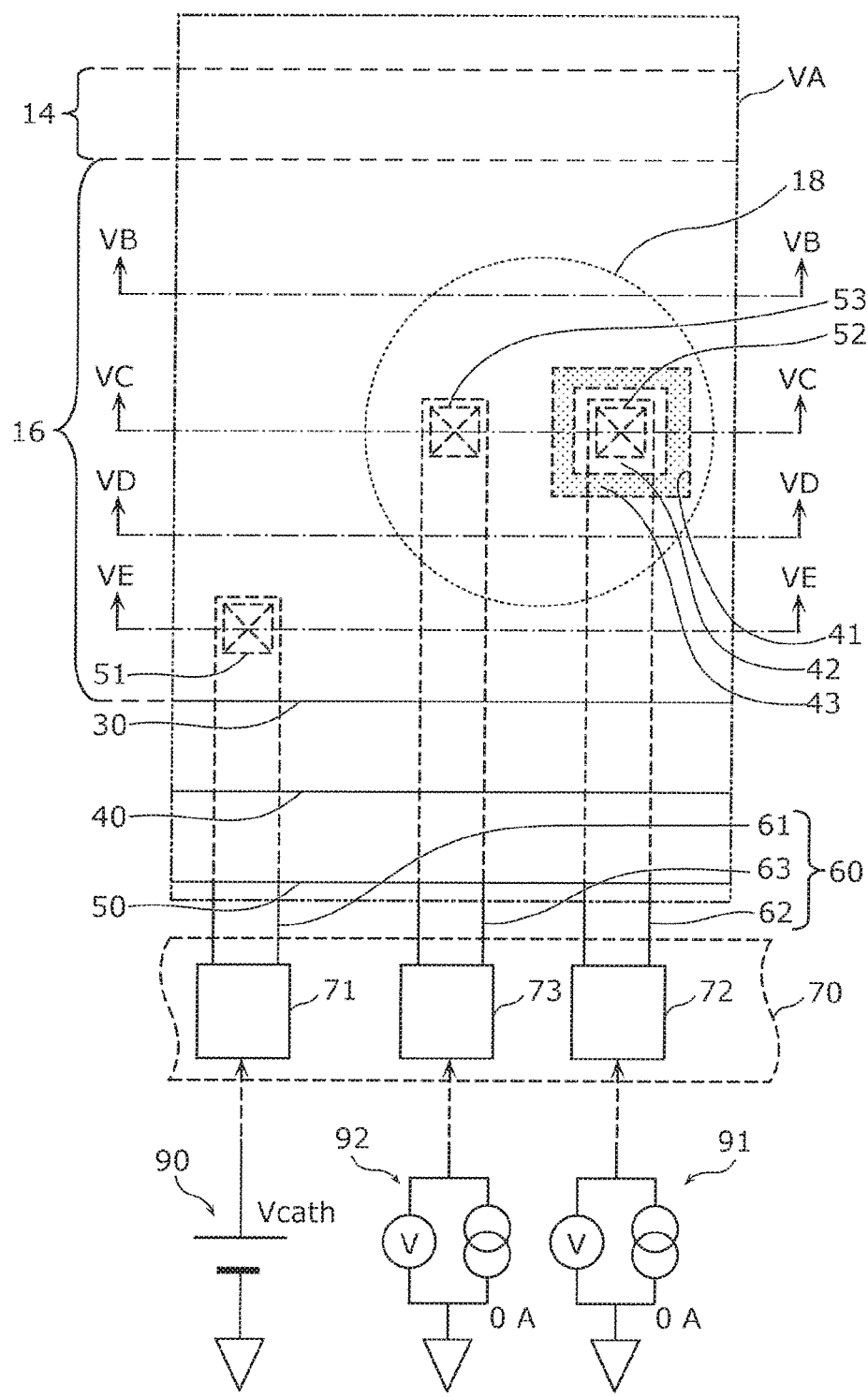
FIG. 5A is a schematic plan view of a configuration of a contact area in the display panel according to Embodiment 1.
Figure 5B:
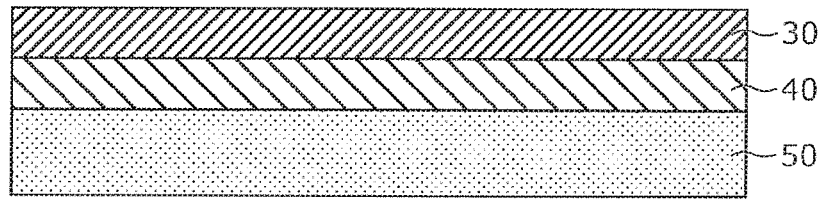
FIG. 5B is a first schematic cross-sectional view of a configuration of the contact area in the display panel according to Embodiment 1.
Figure 5C:
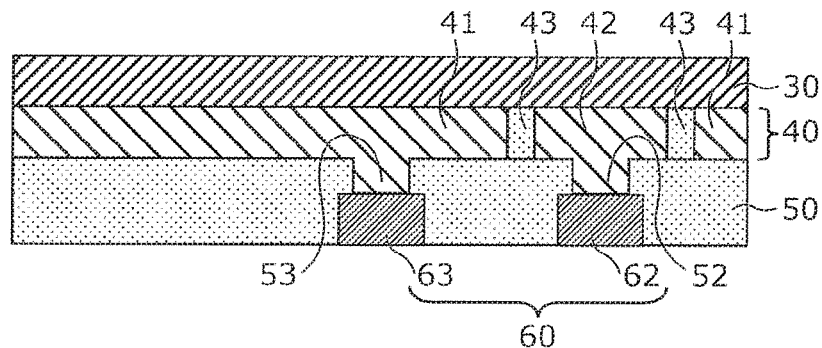
FIG. 5C is a second schematic cross-sectional view of a configuration of the contact area in the display panel according to Embodiment 1.
Figure 5D:
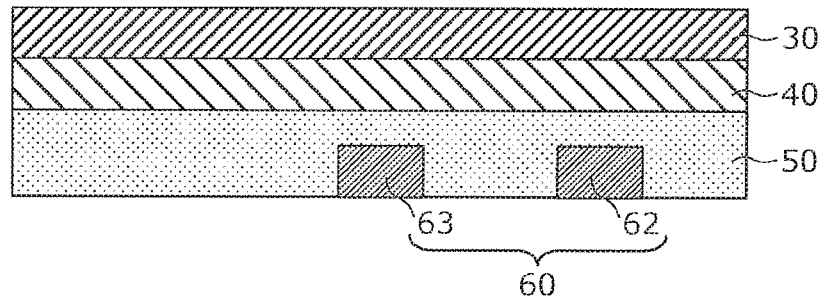
FIG. 5D is a third schematic cross-sectional view of a configuration of the contact area in the display panel according to Embodiment 1.

The contact area 16 includes at least one monitor area 18. Hereinafter, a configuration of the contact area 16 around the monitor area 18 will be described with reference to the drawings. FIG. 5A is a schematic plan view of a configuration of the contact area 16 in the display panel 10 according to the present embodiment. In FIG. 5A, an enlarged view of the inside of a two-dot-chain-line framed portion VA in FIG. 1A is illustrated. FIG. 5B, FIG. 5C, FIG. 5D, and FIG. SE are schematic cross-sectional views of the configuration of the contact area 16 in the display panel 10 according to the present embodiment, FIG. 5B, FIG. 5C, FIG. 5D, and FIG. 5E illustrate the cross-sections taken along the line VB-VB, the line VC-VC, the line VD-VD, and the line VE-VE in FIG. 5A, respectively.

As illustrated in FIG. 5A to FIG. 5E, the contact area 16 includes the upper conductive layer 30, a middle layer 40, an insulating layer 50, and a lower conductive layer 60.

As described above, the upper conductive layer 30 forms the cathode of the organic EL element 140. The upper conductive layer 30 extends from the contact area 16 to the display area 12, According to the present embodiment, the upper conductive layer 30 is a light-transmissive conductive layer, and formed from, for instance, indium zinc oxide (IZO) which is a light-transmissive conductive material.

The lower conductive layer 60 is a conductive layer disposed below the upper conductive layer 30. In the present embodiment, as illustrated in FIG. 5A for instance, the lower conductive layer 60 includes a first line 61, a second line 62, and a third line 63. The lower conductive layer 60 is formed above the substrate 20. The lower conductive layer 60 may be formed directly on the top face of the substrate 20.

The middle layer 40 is disposed between the upper conductive layer 30 and the lower conductive layer 60. As illustrated in FIG. 5A and FIG. 5C, the middle layer 40 includes a conductive first area 41 and a conductive second area 42 which are electrically connected to the upper conductive layer 30 and an insulating separating area 43 which separates the first area 41 and the second area 42. In other words, the separating area 43 is disposed between the first area 41 and the second area 42, and thus the first area 41 does not come into contact with the second area 42. According to the present embodiment, in the plan view of the middle layer 40, the first area 41 surrounds the second area 42. In other words, the second area 42 is separated, as an island, from the first area 41. In the plan view of the middle layer 40, the perimeter of the second area 42 is surrounded by the separating area 43, and the separating area 43 is surrounded by the first area 41. The first area 41 and the second area 42 of the middle layer 40 are formed from a conductive material or the like which includes, for instance, aluminum (Al), nickel (Ni), copper (Cu), and lanthanum (La), and the separating area 43 is formed from, for instance, silicon dioxide ($SiO_2$).

Figure 5E:
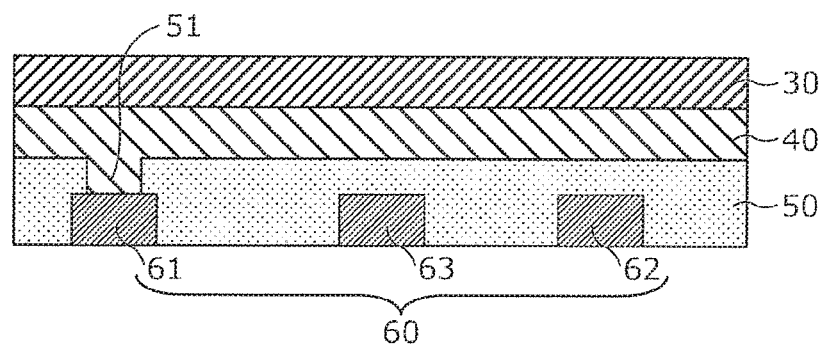
FIG. 5E is a fourth schematic cross-sectional view of a configuration of the contact area in the display panel according to Embodiment 1.

The insulating layer 50 is disposed between the lower conductive layer 60 and the middle layer 40, and formed from an insulating material. The insulating layer 50 includes a first contact hole 51 and a second contact hole 52. As illustrated in FIG. 5E, the first line 61 in the lower conductive layer 60 is electrically connected to the first area 41 of the middle layer 40 via the first contact hole 51. As illustrated in FIG. 5C, the second line 62 of the lower conductive layer 60 is electrically connected to the second area 42 of the middle layer 40 via the second contact hole 52. According to the present embodiment, the insulating layer 50 further includes a third contact hole 53, and as illustrated in FIG. 5C, the third line 63 in the lower conductive layer 60 is electrically connected to the first area 41 via the third contact hole 53. The insulating layer 50 is formed from $SiO_2$, for instance.

The second contact hole 52 and the third contact hole 53 of the insulating layer 50 are contact holes for monitoring a potential, and are disposed in the monitor area 18 as illustrated in FIG. 5A.

[1-5 Pad Placement Area]

Each of the pad placement areas 70 is an area in which a pad-shaped electrode connected to a line drawn out from the contact area 16 is placed. According to the present embodiment, as illustrated in FIG. 1A, the two pad placement areas 70 are disposed adjacent to the contact area 16. For instance, as illustrated in FIG. 5A, the pad placement area 70 includes a first pad 71, a second pad 72, and a third pad 73 which correspond to the first line 61, the second line 62, and the third line 63 of the lower conductive layer 60, respectively.

As illustrated in FIG. 5A, in the display panel 10 according to the present embodiment, in the case where the potential of the upper conductive layer 30 is to be measured, a voltage source 90, a first potential monitor 91, and a second potential monitor 92 are connected to the first pad 71, the second pad 72, and the third pad 73, respectively.

[1-6 Insulating Area]

The insulating area 14 is disposed on the boundary between the contact area 16 and the display area 12, and forms the inner edges of the contact area 16. In the insulating area 14, the upper conductive layer 30 is insulated from the first area 41 and the second area 42 of the middle layer 40. For example, the middle layer 40 need not be provided in the insulating area 14, and a layer formed using an insulating material may be provided as a middle layer.

[1-7 Gate Drive Circuit Area]

Each of the gate drive circuit areas 80 is an area in which a gate drive circuit which generates signals to be supplied to the gate lines 150 in the display panel 10 is disposed. In the gate drive circuit area 80, the gate drive circuit may be formed directly on the substrate 20, or an integrated circuit which constitutes the gate drive circuit may be mounted on the substrate 20.

In the present embodiment, the two gate drive circuit areas 80 are disposed along the two short sides of the outer edges of the rectangular display area 12. The two gate drive circuit areas 80 may be disposed along the long sides of the outer edges of the rectangular display area 12. In this case, the monitor areas 18 are to be disposed in areas where the gate drive circuit areas 80 are not disposed, among the areas along the outer edges of the rectangular display 12.

[1-8 Operation and Effect]

Figure 6A:
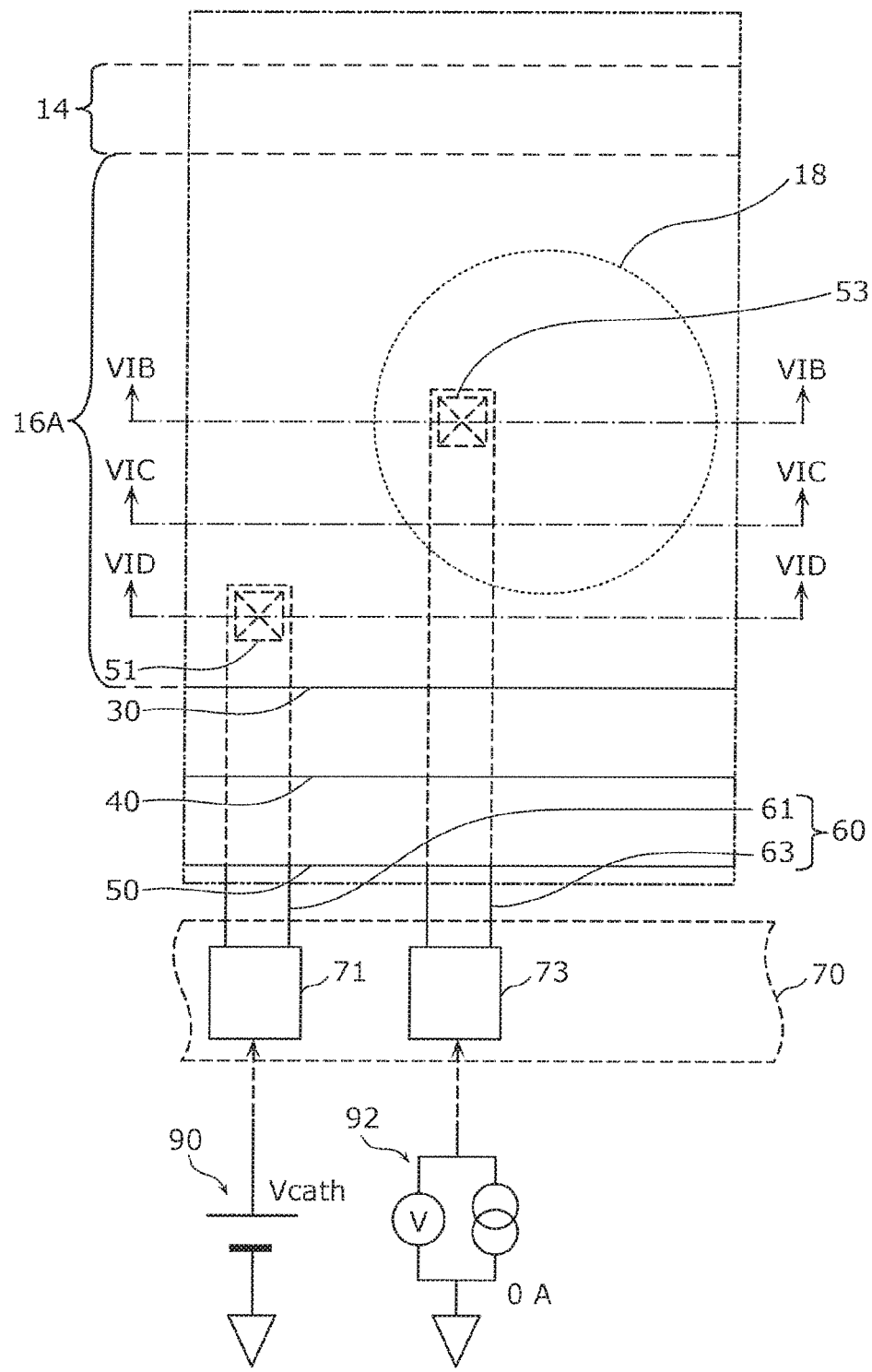
FIG. 6A is a schematic plan view of a configuration of a contact area according to a comparative example.
Figure 6B:
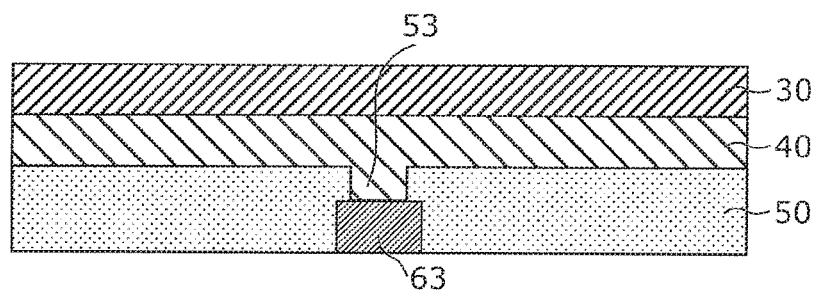
FIG. 6B is a first schematic cross-sectional view of a configuration of the contact area according to the comparative example.
Figure 6C:
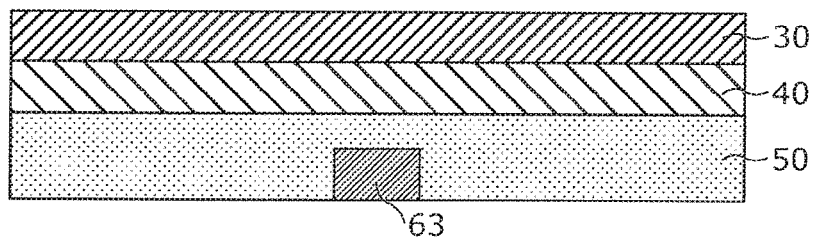
FIG. 6C is a second schematic cross-sectional view of a configuration of the contact area according to the comparative example.
Figure 6D:
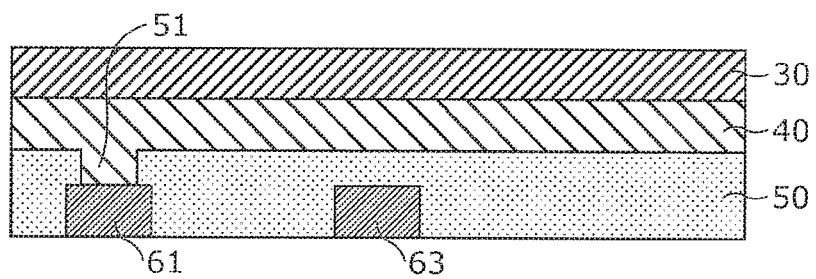
FIG. 6D is a third schematic cross-sectional view of a configuration of the contact area according to the comparative example.
Figure 7:
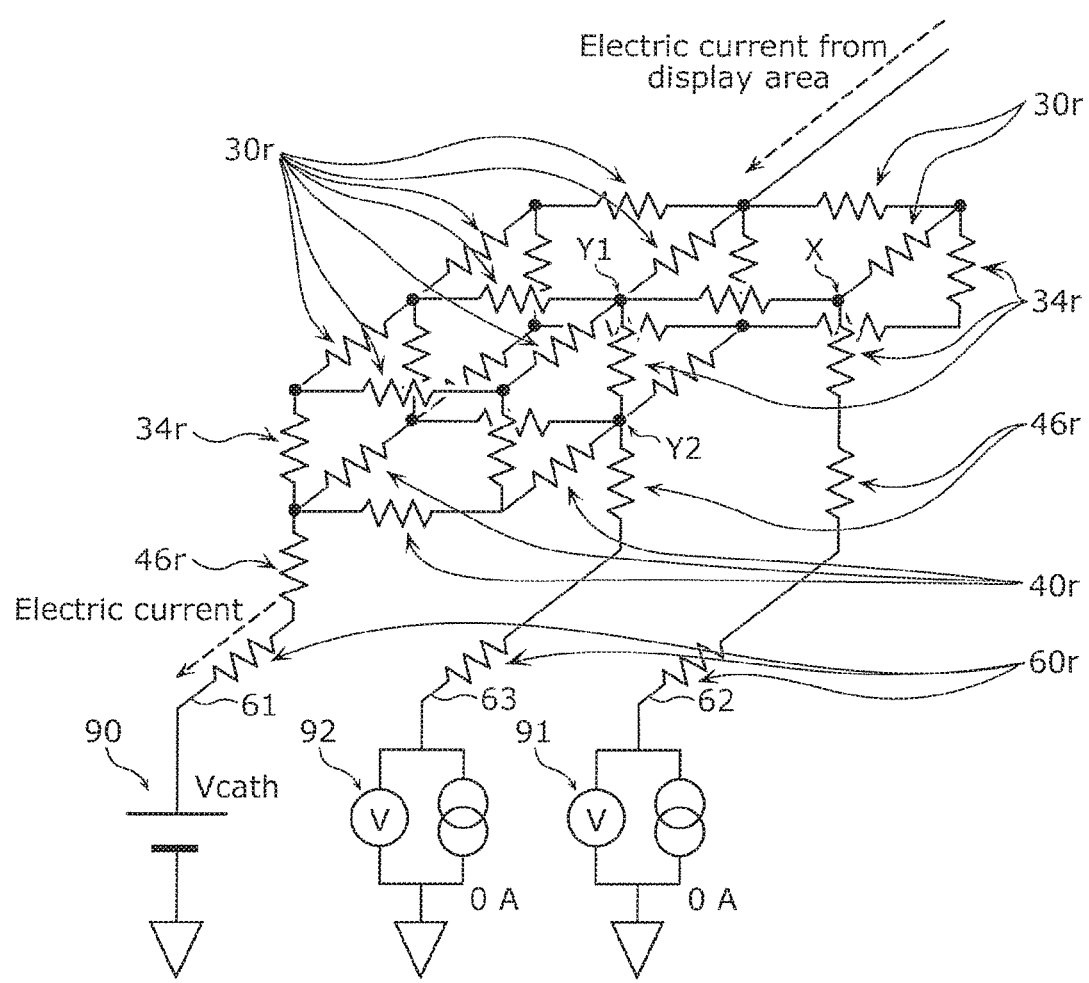
FIG. 7 is a diagram illustrating an equivalent circuit of the contact area according to Embodiment 1.

The operation and the effects of the display panel 10 according to the present embodiment will be described with reference to the drawings and a comparative example. FIG. 6A is a schematic plan view of the configuration of a contact area 16A in a comparative example. Like FIG. 5A, an enlarged view of the contact area 16A around the monitor area 18 is illustrated in FIG. 6A. FIG. 6B, FIG. 6C, and FIG. 6D are schematic cross-sectional views of the configuration of the contact area 16A in the comparative example. FIG. 6B, FIG. 6C, and FIG. 6D illustrate cross-sections taken along the line VIB-VIB, the line VIC-VIC, and the line VID-VID in FIG. 6A, respectively. FIG. 7 is a diagram illustrating an equivalent circuit of the contact area 16 according to the present embodiment. FIG. 7 also illustrates the voltage source 90, the first potential monitor 91, and the second potential monitor 92 which are connected to the first line 61, the second line 62, and the third line 63 of the lower conductive layer 60, respectively.

The contact area 16A according to the comparative example illustrated in FIG. 6A to FIG. 6D is the same as the contact area 16, except that the lower conductive layer 60 does not include the second line 62, the middle layer 40 does not include the separating area 43 (in other words, the entire middle layer 40 is a conductive layer), and the insulating layer 50 does not include the second contact hole 52.

Firstly, the case where a potential is measured using the contact area 16A according to the comparative example will be described. As illustrated in FIG. 6A, a voltage Vcath is applied to the first line 61 via the first pad 71, and the potential of the third line 63 is measured by the second potential monitor 92 via the third pad 73. The potential measured by the second potential monitor 92 in such a case will be described with reference to the drawings. As illustrated in FIG. 6B to FIG. 6D, the third line 63 connected to the second potential monitor 92 is connected to the upper conductive layer 30 via the conductive middle layer 40, but the potential of the third line 63 is different from the potential of the upper conductive layer 30. Hereinafter, the reason why the potential of the third line 63 is different from the potential of the upper conductive layer 30 will be described.

First, the equivalent circuit of the contact area 16 according to the present embodiment illustrated in FIG. 7 will be described. As illustrated in FIG. 7, the first line 61, the second line 62, and the third line 63 are connected to the voltage source 90, the first potential monitor 91, and the second potential monitor 92, respectively. The resistance elements 60r illustrated in FIG. 7 indicate the resistance components of the first line 61, the second line 62, and the third line 63. The resistance elements 30r and 40r illustrated in FIG. 7 indicate the resistance components of the upper conductive layer 30 and the first area 41 in the middle layer 40, respectively. The resistance elements 46r illustrated in FIG. 7 indicate the contact resistance components between the middle layer 40 and each of the first line 61, the second line 62, and the third line 63, The resistance elements 34r illustrated in FIG. 7 indicate the contact resistance components between the upper conductive layer 30 and the middle layer 40.

Note that the equivalent circuit of the contact area 16A of the comparative example can be similarly illustrated as the equivalent circuit illustrated in FIG. 7. Specifically, the equivalent circuit of the contact area 16A in the comparative example can be illustrated as a circuit without the path from the node X to the first potential monitor 91 illustrated in FIG. 7.

As illustrated in FIG. 7, in the respective contact areas according to the present embodiment and the comparative example, contact resistance that is too large to be disregarded is present between the middle layer 40 and the upper conductive layer 30. In addition, when a potential is monitored, the voltage Vcath is applied to the first line 61 by the voltage source 90, and thus a current flows between the display area 12 and the voltage source 90. Consequently, the current flows through the resistance elements 34r equivalent to the aforementioned contact resistance, and thus a voltage drop occurs in the resistance elements 34r. Specifically, a voltage drop occurs between the node Y1 and the node Y2 in FIG. 7. Thus, the potential measured by the second potential monitor 92 is the potential of the node Y2 which corresponds to the middle layer 40, instead of the potential of the node Y1 which corresponds to the upper conductive layer 30, Note that a current does not flow through the resistance elements 46r and 60r included in the path from the node Y2 to the second potential monitor 92, and thus a voltage drop due to these resistance elements does not occur. As described above, the potential of the upper conductive layer 30 cannot be measured by the second potential monitor 92. In other words, the potential of the upper conductive layer 30 cannot be measured in the contact area 16A according to the comparative example.

On the other hand, in the contact area 16 according to the present embodiment, the lower conductive layer 60 includes the second line 62 which is electrically connected to the second area 42 of the middle layer 40 via the second contact hole 52. Like the first area 41, the second area 42 in the middle layer 40 is also in contact with the upper conductive layer 30. Accordingly, contact resistance is present between the first area 41 and the upper conductive layer 30. In FIG. 7, the node X corresponds to a contact portion at which the upper conductive layer 30 contacts the second area 42, and the resistance elements 34r connected to the node X is equivalent to the component of the contact resistance.

As illustrated in FIG. 7, in the same manner as in the path from the node Y1 to the second potential monitor 92, the resistance elements 34r and 46r equivalent to the contact resistance components and the resistance element 60r equivalent to the resistance component of the second line 62 are present in the path from the node X to the first potential monitor 91. However, in the contact area 16 according to the present embodiment, the second area 42 in the middle layer 40 with which the second line 62 is in contact is insulated from the first area 41. Specifically, a current flows through the first area 41 which is a current path between the display area 12 and the voltage source 90, but does not flow through the second area 42 which is insulated from the first area 41. Accordingly, a current does not flow through the contact portion between the upper conductive layer 30 and the second area 42. In other words, a current does not flow through the resistance element 34r connected to the node X in FIG. 7. Accordingly, a voltage drop due to the resistance elements 34r does not occur. In addition, as in the comparative example, the voltage drops due to the resistance elements 46r and 60r do not occur. Consequently, the potential of the upper conductive layer 30 can be measured by the first potential monitor 91.

In the present embodiment, in the plan view of the middle layer 40, the first area 41 surrounds the second area 42, and the first area 41 and the second area 42 are separated by the separating area 43. Since the second area 42 is surrounded by the first area 41 which is separated from the second area 42 by the insulating separating area 43, the flow of a current through the second area 42 from conductive layers other than the first area 41 can be more reliably prevented. Accordingly, the potential of the upper conductive layer 30 can be measured more accurately.

In addition, the contact resistance present between the upper conductive layer 30 and the first area 41 in the middle layer 40 can be measured based on the potential of the upper conductive layer 30 measured by the first potential monitor 91, the potential of the first area 41 in the middle layer 40 measured by the second potential monitor 92, and a measured value of the current which flows through the voltage source 90. In this manner, it is possible to check whether there is a defect in the contact portion between the upper conductive layer 30 and the middle layer 40 is present.

Note that in the present embodiment, the example in which the upper conductive layer 30 forms the cathode of the organic EL device 140 is given; however, the upper conductive layer 30 is not limited to the above. For example, the upper conductive layer 30 may be a conductive layer which forms the anode 141 of the organic EL device 140.

[1-9 Conclusion]

As described above, the display panel 10 according to the present embodiment includes: the display area 12 including the pixels 130 each of which includes the organic electroluminescent (EL) element 140; and the contact area 16 outside the display area 12. The contact area 16 includes: the upper conductive layer 30 forming first electrodes of the organic EL elements 140; the lower conductive layer 60 below the upper conductive layer 30; the middle layer 40 between the upper conductive layer 30 and the lower conductive layer 60; and the insulating layer 50 between the lower conductive layer 60 and the middle layer 40. The insulating layer 50 includes the first contact hole 51 and the second contact hole 52. The middle layer 40 includes: the first area 41 and the second area 42 which are conductive and electrically connected to the upper conductive layer 30; and the insulating separating area 43 which separates the first area 41 and the second area 42. The lower conductive layer 60 includes: the first line 61 which is electrically connected to the first area 41 via the first contact hole 51; and the second line 62 which is electrically connected to the second area 42 via the second contact hole 52.

In this manner, the potential of the first electrodes of the organic EL devices 140 in the display panel 10 can be measured by applying a voltage to the first line 61, and measuring the potential of the second line 62.

In addition, in the display panel 10, the insulating layer 50 may further include the third contact hole 53, and the lower conductive layer 60 may further include the third line 63 which is electrically connected to the first area 41 via the third contact hole 53.

In this manner, the potential of the first area 41 in the middle layer 40 can be measured by applying a voltage to the first line 61, and measuring the potential of the third line 63. Therefore, the contact resistance present between the upper conductive layer 30 and the middle layer 40 can be measured using the measured value of the potential of the upper conductive layer 30, the measured value of the potential of the first area 41 of the middle layer 40, and the measured value of the current which flows through the first line 61. In this manner, it is possible to check whether there is a defect in the contact portion between the upper conductive layer 30 and the middle layer 40 is present.

In addition, in the display panel 10, in a plan view of the middle layer 40, the first area may surround the second area.

In this manner, since the second area 42 is surrounded by the first area 41 which is separated from the second area 42 by the insulating separating area 43, the flow of a current to the second area 42 from conductive layers other than the first area 41 can be more reliably prevented. Accordingly, the potential of the upper conductive layer 30 can be measured more accurately.

In addition, the display panel 10 may further include: the first pad 71 connected to the first line 61; and the second pad 72 connected to the second line 62.

In this manner, a voltage can be readily applied to the first line 61 by connecting the voltage source 90 to the first pad 71. In addition, the potential can be readily measured by connecting the first potential monitor 91 to the second pad 72.

Embodiment 2

A display device according to Embodiment 2 will be described. The display device according to the present embodiment is a display device in which the display panel 10 according to Embodiment 1 is used. Hereinafter, the display device according to the present embodiment will be described with reference to the drawings.

Figure 8:
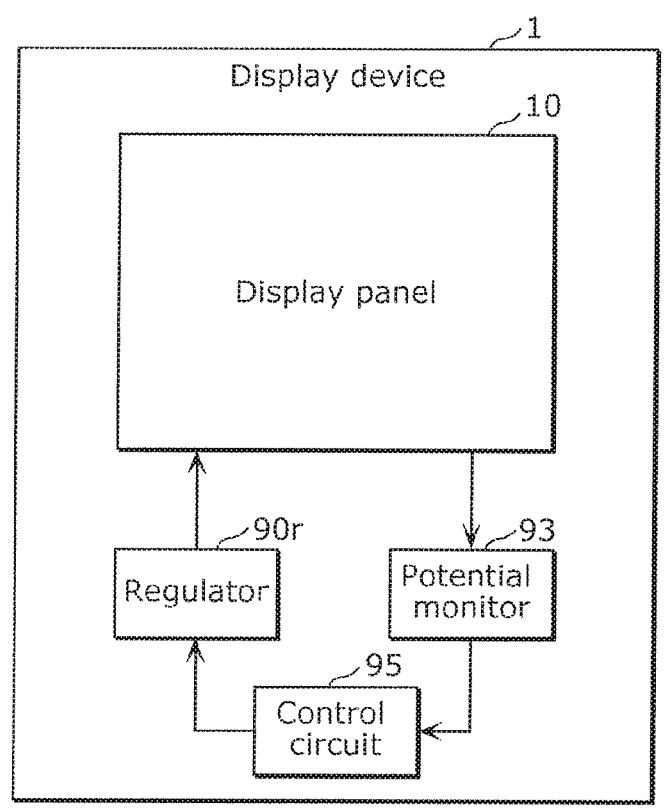
FIG. 8 is a block diagram illustrating a functional configuration of a display device according to Embodiment 2.

FIG. 8 is a block diagram illustrating a functional configuration of a display device 1 according to the present embodiment. The display device 1 uses the display panel 10. For instance, the display device 1 is realized as a flat-panel display. As illustrated in FIG. 8, the display device 1 functionally includes the display panel 10, a potential monitor 93, a control circuit 95, and a regulator 90r.

The regulator 90r is a variable voltage source connected to the first line 61, and applies a voltage to the first line 61.

The potential monitor 93 is connected to the second line 62 and measures the potential of the second line 62. In addition, the potential monitor 93 may be connected to the third line 63 and may measure the potential of the third line 63. The potential monitor 93 outputs a signal equivalent to the measured potential to the control circuit 95.

The control circuit 95 controls, based on the potential of the second line measured by the potential monitor 93, a voltage to be applied to the first line 61 by the regulator 90r. For example, when the difference between the voltage to be applied to the first line 61 and a predetermined value is greater than an allowable value, the control circuit 95 controls the regulator 90r so that the difference becomes less than or equal to the allowable value. For example, when the voltage to be applied to the first line 61 exceeds the predetermined value by more than the allowable value, the control circuit 95 reduces an applied voltage of the regulator 90r.

The control circuit 95 is realized by a micro-controller unit (MCU), for instance. The MCU is a one-chip semiconductor integrated circuit which includes, for instance, a ROM in which a program is stored, a RAM, a central processing unit (CPU) which executes the program, a timer, and an input output circuit which includes an analog-to-digital converter (ADC) and a digital-to-analog converter (DAC).

As described above, the display device 1 according to the present embodiment includes the display panel 10 according to Embodiment 1. In this manner, the display device 1 produces the same effect as the display panel 10.

In addition, the display device 1 further includes the regulator 90r which is connected to the first line 61 and applies a voltage to the first line 61, and the potential monitor 93 which is connected to the second line 62 and measures the potential of the second line 62. The display device 1 further includes the control circuit 95 which controls the voltage applied to the first line 61 by the regulator 90r, based on the potential of the second line 62 measured by the potential monitor 93.

In this manner, in the display device 1, the voltage to be applied to the first electrodes of the organic EL devices 140 can be controlled to be a predetermined value.

Other Embodiment

While the foregoing has described the display panel, etc., according to the present disclosure based on the exemplary embodiments, the display panel, etc., according to the present disclosure are not limited to the exemplary embodiments. Different embodiments realized by combining arbitrary elements in the exemplary embodiments, variations obtained by various modifications to the exemplary embodiments which may be conceived by a person skilled in the art without departing from the scope of the present disclosure, and various devices that include the display device according to the present embodiment are also included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful for a flat-panel display which includes an organic EL element, for instance.

The invention claimed is:

1. A display panel, comprising:
   a display area including pixels each of which includes an organic electroluminescent (EL) element; and
   a contact area outside the display area, wherein
   the contact area includes:
      an upper conductive layer forming first electrodes of the organic EL elements;
      a lower conductive layer below the upper conductive layer,
      a middle layer between the upper conductive layer and the lower conductive layer; and
      an insulating layer between the lower conductive layer and the middle layer,
   the insulating layer includes a first contact hole and a second contact hole,
   the middle layer includes:
      a first area and a second area which are electrically connected to the upper conductive layer, the first area and the second area being conductive areas; and
      a separating area which separates the first area and the second area, the separating area being an insulating area, and
   the lower conductive layer includes:
      a first line which is electrically connected to the first area via the first contact hole; and
      a second line which is electrically connected to the second area via the second contact hole.

2. The display panel according to claim 1, wherein
   the insulating layer further includes a third contact hole, and
   the lower conductive layer further includes a third line which is electrically connected to the first area via the third contact hole.

3. The display panel according to claim 1, wherein
   in a plan view of the middle layer, the first area surrounds the second area.

4. The display panel according to claim 1, further comprising:
   a first pad connected to the first line; and
   a second pad connected to the second line.

5. A display device, comprising:
   the display panel according to claim 1.

6. The display device according to claim 5, further comprising:
   a regulator which is connected to the first line and applies a voltage to the first line;
   a potential monitor which is connected to the second line and measures a potential of the second line; and
   a control circuit which controls, based on the potential of the second line measured by the potential monitor, the voltage to be applied to the first line by the regulator.

* * * * *